(12) United States Patent
Kurita

(10) Patent No.: US 8,349,649 B2
(45) Date of Patent: Jan. 8, 2013

(54) SEMICONDUCTOR DEVICE AND MANUFACTURING METHOD THEREOF

(75) Inventor: Yoichiro Kurita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 183 days.

(21) Appl. No.: 12/905,167

(22) Filed: Oct. 15, 2010

(65) Prior Publication Data

US 2011/0089573 A1   Apr. 21, 2011

(30) Foreign Application Priority Data

Oct. 15, 2009   (JP) .................................. 2009-238499

(51) Int. Cl.
| H01L 21/00 | (2006.01) |
| H01L 21/30 | (2006.01) |
| H01L 21/46 | (2006.01) |
| H01L 23/02 | (2006.01) |
| H01L 21/40 | (2006.01) |
| H01L 21/48 | (2006.01) |
| H01L 21/52 | (2006.01) |

(52) U.S. Cl. ........ 438/107; 438/108; 438/109; 438/455; 257/686; 257/773; 257/774; 257/778
(58) Field of Classification Search .......... 438/106–127, 438/455–459; 257/678–733
See application file for complete search history.

(56) References Cited

U.S. PATENT DOCUMENTS

| 2002/0160598 | A1* | 10/2002 | Kong | 438/613 |
| 2002/0180372 | A1* | 12/2002 | Yamazaki | 315/169.3 |
| 2004/0113261 | A1* | 6/2004 | Sunohara et al. | 257/700 |
| 2006/0063312 | A1* | 3/2006 | Kurita | 438/127 |
| 2006/0226556 | A1* | 10/2006 | Kurita et al. | 257/778 |
| 2007/0126085 | A1* | 6/2007 | Kawano et al. | 257/621 |
| 2009/0180257 | A1* | 7/2009 | Park et al. | 361/709 |

FOREIGN PATENT DOCUMENTS

| JP | 2004-327474 | 11/2004 |
| JP | 2006-019433 | 1/2006 |
| JP | 2006-301863 | 11/2006 |
| JP | 2008-159805 | 7/2008 |

* cited by examiner

Primary Examiner — Fernando L Toledo
Assistant Examiner — Karen Kusumakar
(74) Attorney, Agent, or Firm — Young & Thompson

(57) ABSTRACT

A semiconductor device includes a first interposer provided with a first chip first interconnection; a first chip arranged to contact the first interposer in one surface of the first chip; a second interposer arranged to contact the other surface of the first chip and provided with a first chip second interconnection; and a second chip group mounted on the second interposer. The first chip has a circuit forming surface on which a circuit element is formed, as one of the surfaces of the first chip, and the first chip first interconnection and the first chip second interconnection are electrically connected with the circuit element. A through electrode is formed to pass from the one of the surfaces of the first chip to the other surface, and one of the first chip first interconnection and the first chip second interconnection is electrically connected with the circuit element through the through electrode.

6 Claims, 10 Drawing Sheets

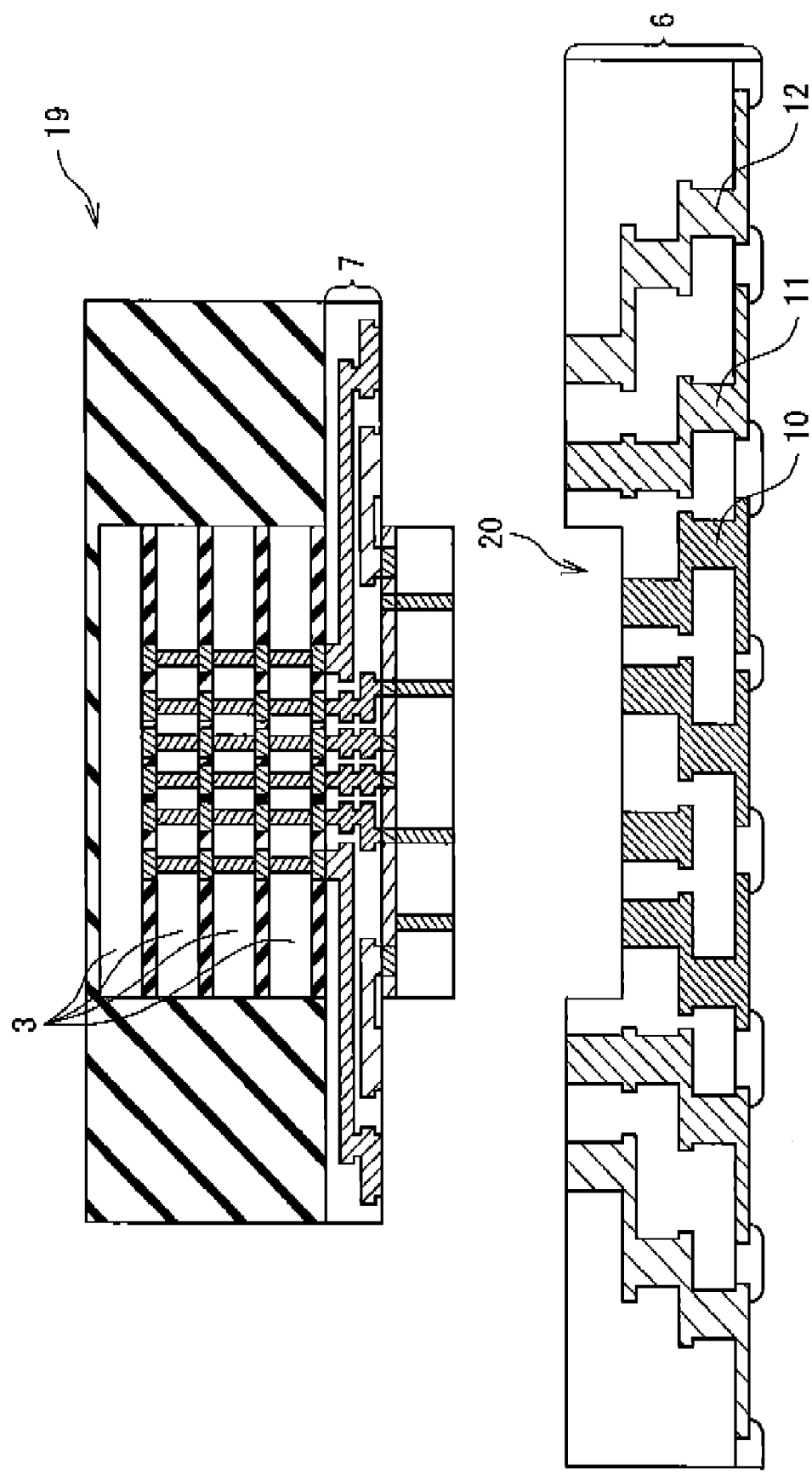

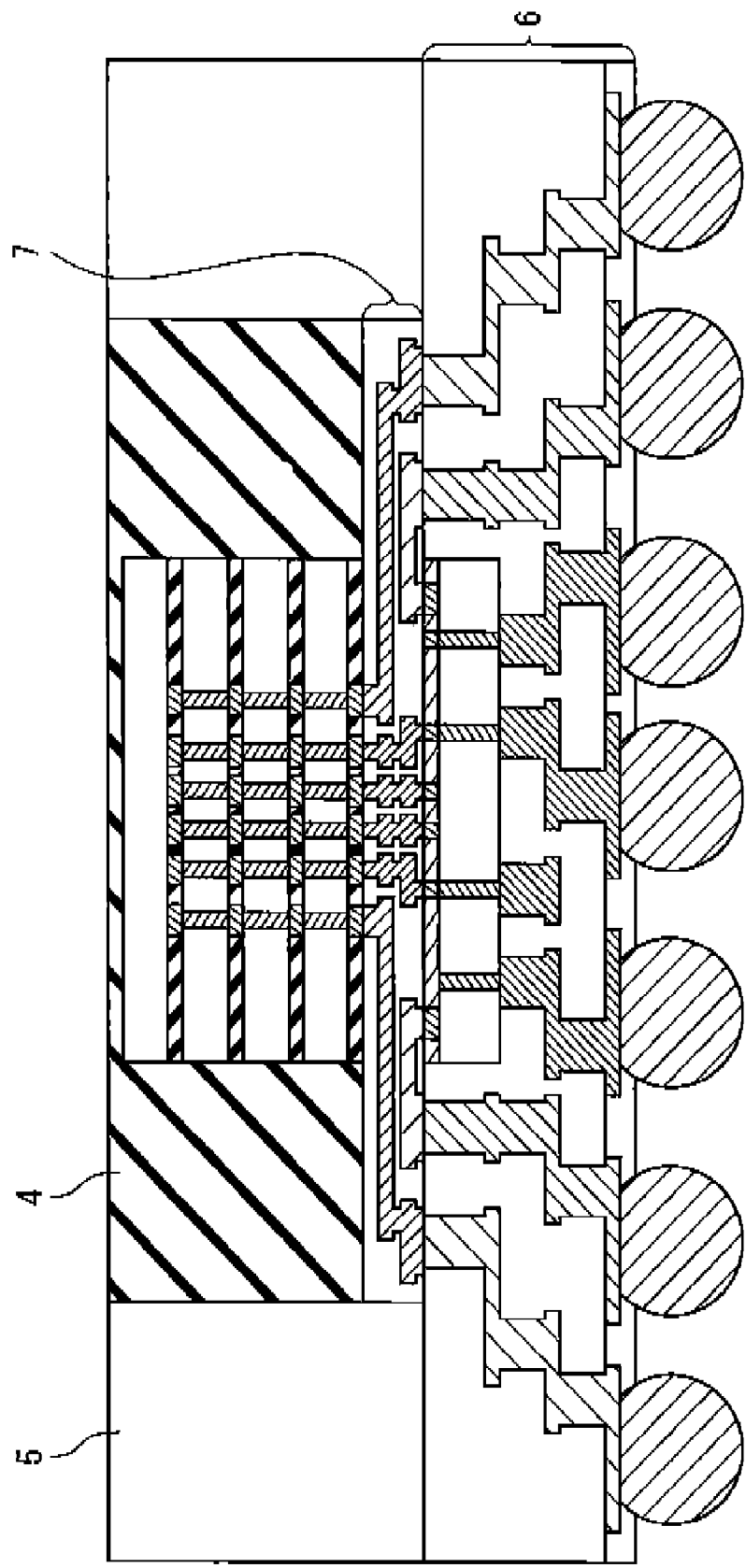

SEMICONDUCTOR DEVICE AND MANUFACTURING METHOD THEREOF

INCORPORATION BY REFERENCE

This patent application claims a priority on convention based on Japanese Patent Application No. 2009-238499 filed on Oct. 15, 2009. The disclosure thereof is incorporated herein by reference.

BACKGROUND

1. Field of the Invention

The present invention relates to a semiconductor device and a method of manufacturing a semiconductor device.

2. Description of Related Art

A semiconductor device is known which is provided with a semiconductor chip. A connection section is provided for the semiconductor device to electrically connect the semiconductor chip with another device. For example, the connection section is attained by bonding wires and interconnections of an interposer substrate.

A semiconductor device is disclosed in Patent Literature 1 (Japanese Patent Publication (JP 2006-19433A)). The semiconductor device includes a plate-like interconnection body, a first semiconductor element provided on one of the surfaces of the interconnection body, sealing resin provided to cover the one surface and the side of the first semiconductor element, and a second semiconductor element provided for the other surface of the interconnection body. The interconnection body is provided with an interconnection layer, a support layer to support the interconnection layer and through electrode passing through the interconnection layer and the support layer. The first semiconductor element and the second semiconductor element are electrically connected through the interconnection body.

A print circuit board is disclosed in Patent Literature 2 (Japanese Patent Publication (JP 2008-159805A)). The print circuit board includes a first member which has a part mounting surface, a built-in part mounted on the part mounting surface and having a through electrode, a second member stacked on the first member through an insulating layer which covers the built-in part, a hole section provided for the second member and communicating with the through electrode of the built-in part, and an exterior part mounted on the second member and directly connected with the through electrode through the hole section. The through electrode is connected to so-called open pad that is not connected with another interconnection pattern of the built-in part.

Besides, Patent literature 3 (Japanese Patent Publication (JP 2004-327474A) and Patent Literature 4 (Japanese Patent Publication (JP 2006-301863A)) are known.

CITATION LIST

[Patent Literature 1]: JP 2006-19433A
[Patent Literature 2]: JP 2008-159805A
[Patent Literature 3]: JP 2004-327474A,
[Patent Literature 4]: JP 2006-301863A

SUMMARY

When a bonding wire is used for a connection, the bonding wire is connected with a circuit forming surface of the semiconductor chip. There is a limitation in the number of bonding wires which can be connected with the circuit forming surface. Therefore, the function of the semiconductor chip is limited, depending on the number of bonding wires.

On the other hand, in the semiconductor device disclosed in Patent Literature 1, a connection section connected with the semiconductor chip (first and second semiconductor elements) is formed in an interconnection body (interposer). There is a limitation in a density of interconnections which can be formed in the interconnection body. Therefore, in the semiconductor device, the function of a semiconductor chip has been limited. Especially, when the semiconductor chip is used in which a circuit of a high power consumption amount is formed, the width of an interconnection to supply power needs to be made wide. As a result, a space for the interconnections to be arranged to input and output signals is further limited in the interposer and the function of the semiconductor chip is further limited.

Any device to sufficiently secure a space for the interconnections connected with a semiconductor chip (built-in parts) is not especially described in Patent Literature 2.

In an aspect of the present invention, a semiconductor device includes: a first interposer provided with a first chip first interconnection; a first chip arranged to contact the first interposer in one of surfaces of the first chip; a second interposer arranged to contact the other surface of the first chip and provided with a first chip second interconnection; and a second chip group mounted on the second interposer. The first chip has a circuit forming surface on which a circuit element is formed, as one of the surfaces of the first chip, and the first chip first interconnection and the first chip second interconnection are electrically connected with the circuit element. A through electrode is formed to pass from the one of the surfaces of the first chip to the other surface, and one of the first chip first interconnection and the first chip second interconnection is electrically connected with the circuit element through the through electrode.

In another aspect of the present invention, a semiconductor device includes: a first chip having a principal surface as a circuit forming surface where a circuit element is formed; a first interposer provided to contact a back surface of the first chip; and a second interposer having a back surface in contact with the principal surface of the first chip. A through electrode is provided in the first chip to connect the back surface and the principal surface, and a first chip signal interconnection is formed in the second interposer to be connected with a signal terminal provided at the principal surface of the first chip. A first chip power supply interconnection is formed in the first interposer to supply the first chip with a power supply voltage, and the first chip power supply interconnection contacts the through electrode in the back surface of the first chip.

In still another aspect of the present invention, a method of manufacturing a semiconductor device is achieved by providing a first interposer in which a first chip first interconnection is formed; by providing a first chip having a circuit forming surface on which a circuit element is formed; by providing a second interposer in which a first chip second interconnection is formed; by providing a second chip group; by forming a through electrode in the first chip to pass from a principal surface to a back surface; by mounting the second chip group on a principal surface of the second interposer; by arranging the first chip on a back surface of the second interposer such that the first chip second interconnection is electrically connected with the circuit element; and by arranging the first chip on the first interposer such that the first chip first interconnection is electrically connected with the circuit element. One of the first chip first interconnection and the first chip second interconnection is electrically connected with the circuit element through the through electrode.

In yet still another aspect of the present invention, a method of manufacturing a semiconductor device is achieved by providing a first chip in which a circuit is formed on a principal surface; by providing a first interposer in which a first chip power supply interconnection is formed; by providing a second interposer in which a first chip signal interconnection is formed; by forming a through electrode in the first chip so as to connect the principal surface and a back surface and to be connected with a power supply terminal of the circuit on a principal surface; by arranging the first chip on the back surface of the second interposer such that the first chip signal interconnection is connected with a signal terminal of the circuit formed on the principal surface of the first chip; and by arranging the first chip on the first interposer such that the first chip power supply interconnection contacts the through electrode in the back surface of the first chip.

According to the present invention, the semiconductor device and the manufacturing method of the same are provided in which interconnections can be arranged in a high density.

BRIEF DESCRIPTION OF THE DRAWINGS

The above and other objects, advantages and features of the present invention will be more apparent from the following description of certain embodiments taken in conjunction with the accompanying drawings, in which:

FIGS. 2A to 2H are sectional views schematically showing a manufacturing method of the semiconductor device according to the first embodiment;

DETAILED DESCRIPTION OF THE PREFERRED MODES

Hereinafter, a semiconductor device according to the present invention will be described in detail with reference to the attached drawings.

First Embodiment

A semiconductor device according to a first embodiment of the present invention will be described.

Figure 1:
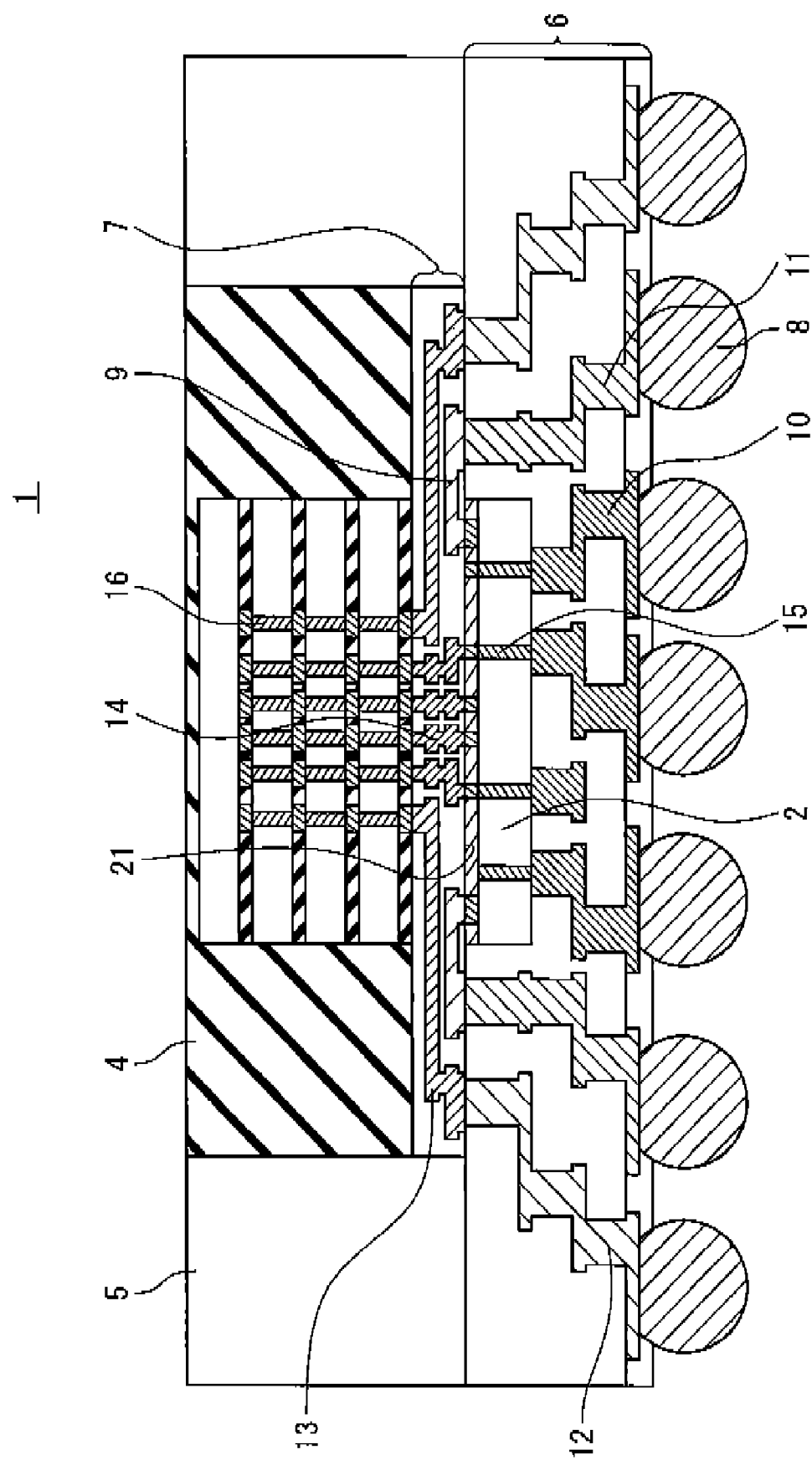
FIG. 1 is a sectional view schematically showing a semiconductor device according to a first embodiment of the present invention.

FIG. 1 is a sectional view schematically showing a semiconductor device 1 according to the present embodiment. As shown in FIG. 1, a semiconductor device 1 is provided with a first chip 2, a second chip group 3, a first interposer 6, a second interposer 7, a sealing body 4 and an outer form holding member 5.

The first interposer 6 is provided to electrically connect the first chip 2 and the second chip group 3 with an external device (not shown). The first interposer 6 is provided with second chip external interconnections 12, first chip first interconnections 10 and interconnections 11. The second chip external interconnection 12 is provided to electrically connect the second chip group 3 with the external device. The first chip first interconnection 10 is provided to supply a power supply voltage to the first chip 2. It should be noted that the power supply voltage in this specification contains the ground voltage. The interconnection 11 is a signal interconnection to exchange a signal between the first chip 2 and the external device.

External electrodes 8 are provided for the back surface of the first interposer 6. For example, the external electrode 8 is such as a solder bump. The first chip first interconnection 10, the second chip external interconnection 12 and the interconnection 11 are connected with the external electrodes 8, respectively. These external electrodes 8 are electrically connected with the external device.

A concave section is formed in a principal surface of the first interposer 6 to have a shape corresponding to the first chip 2. The first chip 2 is embedded in the concave section. The principal surface of the first interposer 6 and the principal surface of the first chip 2 are in the substantially same plane.

The material of the first interposer 6 as mentioned above is not especially limited.

Next, the first chip 2 will be described. In the first chip 2, circuit elements are formed on the principal surface. That is the principal surface of the first chip is a circuit forming surface 21. It is supposed that the circuit elements have a logic function. The circuit elements contain a power supply terminal and a signal terminal (both not shown). Also, through electrodes 15 are provided for the first chip 2 to pass from the principal surface to a back surface. Through electrodes 15 are generally called as TSV (Through-Silicon Via) when the first chip 2 is composed of Si substrate. The through electrode 15 is connected with the power supply terminal of the circuit element in the principal surface and is connected with the first chip first interconnection 10 in the back surface. That is a power supply voltage is supplied from the external device to the circuit elements formed in the first chip 2 through the first chip first interconnection 10 and the through electrode 15. Thus, the first chip first interconnection 10 functions as a power supply interconnection. The through electrode 15 is formed as a metal electrode.

Next, the second interposer 7 will be described. The second interposer 7 is arranged on the principal surface of the first interposer 6. The second interposer 7 is wider than the first chip 1 to cover the principal surface of the first chip 1. The second interposer 7 contacts the principal surface of the first chip 1.

Through electrodes 14, first chip second interconnections 9 and second chip external connection interconnections 13 are formed in the second interposer 7. These are formed as metal layers.

The through electrode 14 is provided to electrically connect the first chip 2 and the second chip group 3. The through electrode 14 is formed to pass through the second interposer 7. The through electrode 14 is connected with the circuit element provided for the principal surface of the first chip 2.

The first chip second interconnection 9 is provided to electrically connect the signal terminal of the first chip 2 with the external device. That is, the first chip second interconnection 9 functions as a signal interconnection. The first chip second interconnection 9 is connected with the signal terminal of the circuit element provided for the first chip 2 in one end. In addition, the other end of the first chip second interconnection 9 is connected with the interconnection 11 provided for the first interposer 6. That is, the signal terminal of the first chip 2 is electrically connected with the external device through the first chip second interconnection 9, the interconnection 11 and the external electrode 8.

The second chip external connection interconnection 13 is provided to electrically connect the second chip group 3 with the external device. One end of the second chip external connection interconnection 13 is connected with the second chip external interconnection 12 provided for the first interposer 6 in the back surface of the second interposer 7. Also, the other end of the second chip external connection interconnection 13 is exposed in the principal surface of the second interposer 7.

As described above, many interconnections (the through electrodes 14, the first chip second interconnections 9 and the second chip external connection interconnections 13) are formed in the second interposer 7. Also, the number of signal terminals increases more as the logic function of the first chip 2 is made higher. Therefore, it is required to arrange the first chip second interconnections 9 in a high density. From these viewpoints, the material of the second interposer 7 is selected to allow the interconnections to be arranged in a higher density than in the first interposer. For example, it is desirable to use the second interposer 7, in which the interconnections of metals such as copper are formed inside or on an organic insulation resin layer (for example, a polyimide resin layer and an epoxy layer). Moreover, from the viewpoint of allowing formation of a fine interconnection pattern, it is also desired to use the interposer, which is provided with a support layer formed of silicon, ceramic, glass and so on, an interconnection layer formed of Cu and Al on the support layer, and through electrodes.

Next, the second chip group 3 will be described. The second chip group 3 is mounted onto the principal surface of the second interposer 7. The second chip group 3 is provided with the plurality of second chips stacked. A circuit element with a memory function is formed in each second chip. The second chip through electrodes 16 are formed in each second chip to pass through the second chip. The second chip in the lowest layer is connected with the second chip external connection interconnections 13 and the through electrodes 14. Each second chip is electrically connected with the second chip external connection interconnection 13 and the through electrode 14 through the second chip through electrodes 16.

Next, the sealing body 4 and the outer form holding member 4 will be described. The sealing body 4 is used to protect the second interposer 7 and the second chip group 3. The sealing body 4 is provided onto the principal surface of the second interposer 7. The sealing body 4 is provided be cover the second chip group 3. For example, the sealing body 4 is formed of a resin layer.

The outer form holding member 5 is provided to hold the outer form of the semiconductor device 1. The outer form holding member 5 is provided onto the principal surface of the first interposer 6. The outer form holding member 5 is formed to cover the sides of the second interposer 7 and the sealing body 4.

By adopting the above mentioned structure, the following effects are obtained. According to this embodiment, by using the second interposer 7, the logic chip (the first chip 2) and the memory chip group (the second chip group 3) can be connected in a short distance. Here, a chip with a larger power consumption amount is sometimes used as the first chip 2. In such a case, in order to sufficiently supply the power to the first chip 2, it is necessary to provide a wider width of the interconnection for the power supply.

It is supposed for comparison with this embodiment that the interconnection to supply the power supply voltage to the first chip 2 is provided for the second interposer 7. In this case, a space where the other interconnections (the first chip second interconnections 9, the through electrodes 14 and the second chip external connection interconnections 13) can be arranged in the second interposer 7 has become narrow. On the other hand, in this embodiment, the supply of the power supply voltage to the first chip 2 is carried out through the first chip first interconnection 10 and the through electrode 15. That is, the power can be supplied from the side of the back surface of the first chip 2. It is not necessary to provide an interconnection for the second interposer 7 in order to supply the power supply voltage to the first chip 2. Therefore, the space for arranging the other interconnections such as the signal interconnections in the second interposer 7 can be sufficiently secured.

It should be noted that a plurality of power supply paths to the first chip 2 may be provided. In such a case, it is sufficient that at least one of the power supply paths is the through electrode 15. Even if a part of the power supply paths is formed to pass through the second interposer 7, the effect to increase the interconnection density in the second interposer 7 can be obtained.

In this embodiment, a case where the power supply voltage is supplied to the first chip 2 through the through electrode 15 has been described. However, not the power supply interconnection but a part of a large capacity of signal interconnections may be connected with the circuit elements of the first chip 2 through the through electrodes 15. Even if such a structure is adopted, it is possible to secure the space sufficiently in the second interposer 7.

In addition, according to this embodiment, the excellent heat radiation efficiency is provided. That is, in this embodiment, the circuit forming surface (principal surface) of the first chip 2 is covered by the second interposer 7. In such a structure, although the first chip 2 and the second chip group 3 can be connected in the short distance, the heat generated in the circuit forming surface is easy to be accumulated. However, in this embodiment, the principal surface of the first chip 2 is connected with the back surface of the first interposer 6 through the through electrodes 15 and the first chip first interconnections 10. Because the through electrodes 15 and the first chip first interconnections 10 are formed of metal, the heat radiation path is formed to connect the principal surface of the first chip 2 and the back surface of the first interposer 6. It can be prevented by this heat radiation path that the heat has accumulated in the principal surface of the first chip 2 and it can be made possible to improve the reliability of the first chip 2.

It should be noted that in this embodiment, a case that the second chip group 3 is provided with the plurality of second chips has been described. However, the number of second chips is not always plural and the second chip may be single.

In this embodiment, the first chip 2 is single. However, it is possible to prepare and stack a plurality of the first chips 2.

Next, a manufacturing method of the semiconductor device according to this embodiment will be described. FIGS. 2A to 2H are cross-sectional views showing the manufacturing method of the semiconductor device.

Figure 2A:
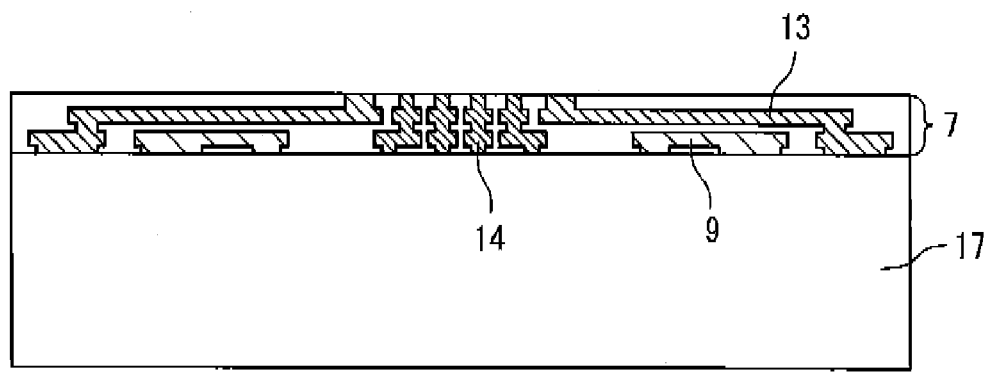

At first, as shown in FIG. 2A, a support body 17 is prepared and the second interposer 7 is formed on the support body 17. At this time, the through electrodes 14, the second chip external connection interconnections 13 and the first chip second interconnections 9 are formed in the second interposer 7. As the support body 17, a material having a high stiffness is desirably used. Also, as the support body 17, the material having a thermal expansion coefficient near to those of the first chip 2 and the second chip group 3 is used. Therefore, as the support body 17, specifically, a silicon substrate, a glass substrate and a ceramic substrate and so on are used. For example, as the second interposer 7, a plate member can be used in which a metal interconnection layer (Cu interconnection layer) is formed on the organic insulation resin layer (e.g. a polyimide resin layer and an epoxy resin layer).

Figure 2B:
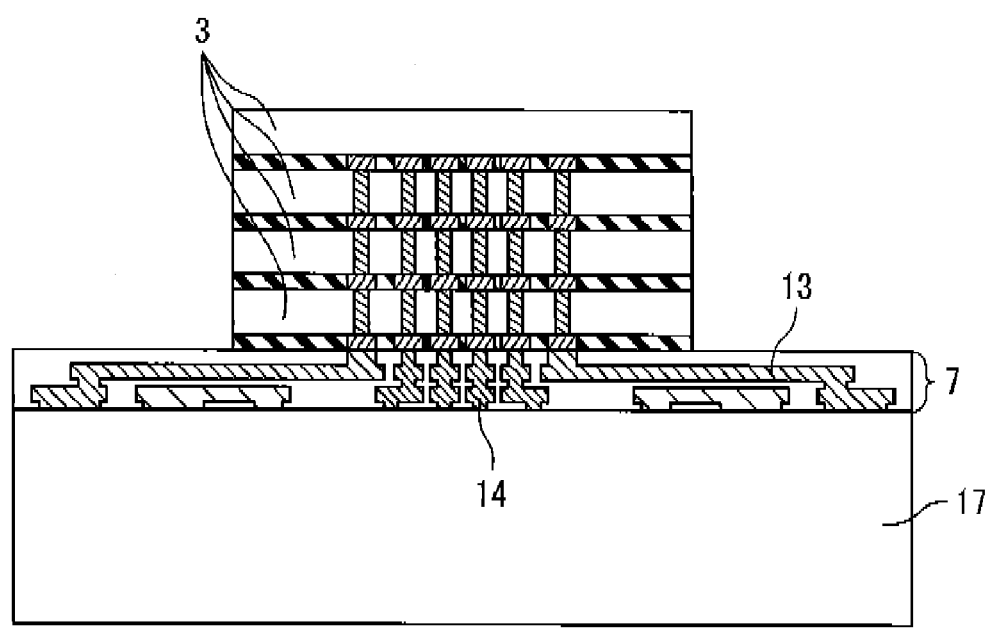

Next, the second chip group is stacked. As shown in FIG. 2B, the second chip group 3 is stacked on the principal surface of the second interposer 7. AT this time, the second chip group 3 is stacked to be connected with the second chip external connection interconnection 13 and the through electrode 14.

Figure 2C:
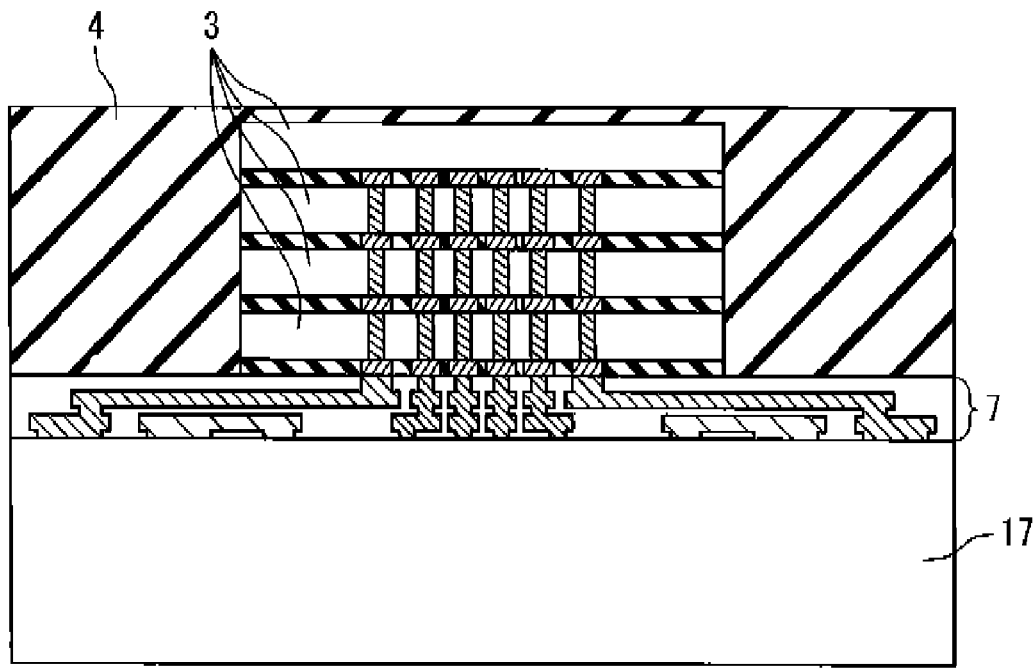

Next, as shown in FIG. 2C, the sealing body 4 is formed on the principal surface of the second interposer 7. The sealing body 4 is formed to corer sides of the second chip group 3.

Figure 2D:
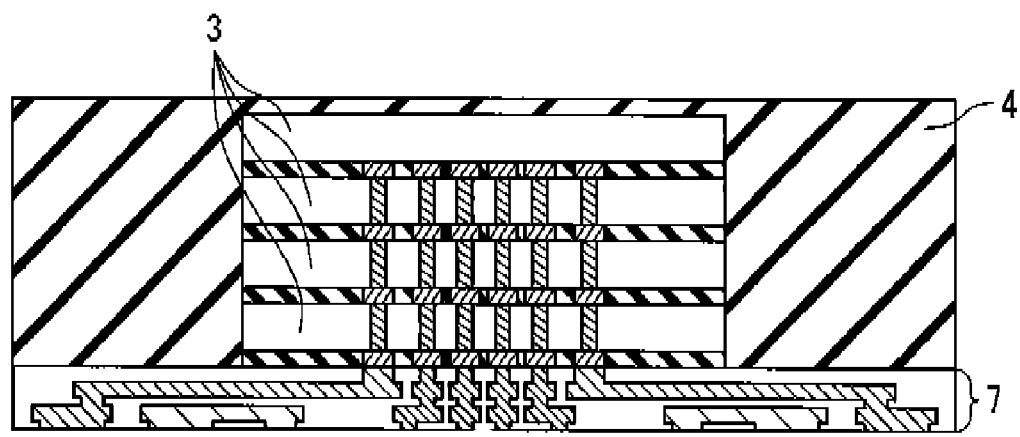

Next, as shown in FIG. 2D, the support body 17 is separated from the second interposer 7. This exposes the back surface of the second interposer 7.

Figure 2E:
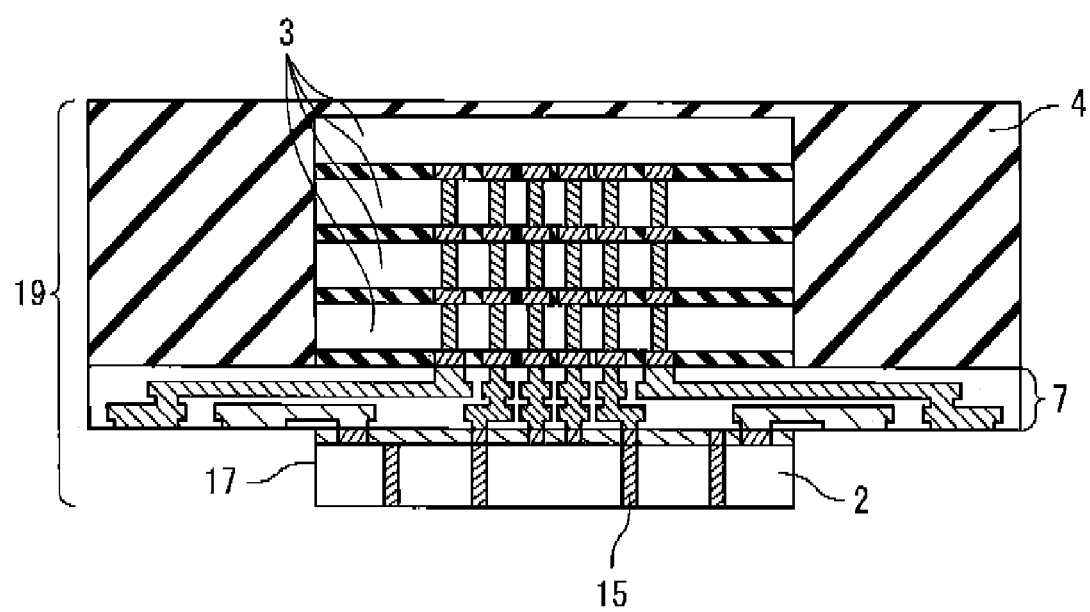

Next, the first chip is manufactured which has the through electrodes 15 and the circuit elements. As shown in FIG. 2E, the first chip 2 is arranged on the back surface of the second interposer 7. At this time, the first chip 2 is arranged such that the circuit forming surface 21 is opposite to the second interposer 7. Also, the first chip 2 is arranged such that the signal terminals of the circuit elements are connected with the first chip second interconnections 9.

It is desirable that the process shown in FIGS. 2A to 2D is executed on a large-size wafer. After arranging the first chip 2, a chip stack structure 19 is obtained as each module through the cutting.

Next, the first interposer 6 is prepared. The first interposer 6 has the concave section 20 with the shape corresponding to the first chip 2 in the principal surface. Also, as mentioned above, the first chip first interconnection 10, the interconnection 11 and the second chip external interconnection 12 are formed in the first interposer 6.

As mentioned above, a method of manufacturing the first interposer 6 is not especially limited. For example, it is desirable to adopt a method of manufacturing the first interposer 6 of a multilayer structure through collective stack from the viewpoint of a manufacturing cost. In a case of this method, first, a patterned interconnection layer is formed an an insulating layer as an interconnection sheet. A half hardening resin (pre-preg) is arranged on the interconnection sheet. Also, a through electrode sheet with through electrodes is prepared. Then, the collective stack is performed by stacking and pressing these sheets. However, the first interposer 6 may be manufactured by a sequential stack as adopted in the usual build-up interconnection substrate.

Next, as shown in FIG. 2F, the chip stack structure 19 is mounted onto the principal surface of the first interposer 6. At this time, the chip stack structure 19 is mounted such that the first chip 2 is arranged in the concave section 20. Thus, the through electrode 15 of the first chip 2 is connected with the first chip first interconnection 10 in the back surface of the first chip 2. Also, the second chip external connection interconnection 13 and the first chip second interconnection 9 are connected with the second chip external interconnection 12 and the interconnection 11, respectively.

Figure 2G:
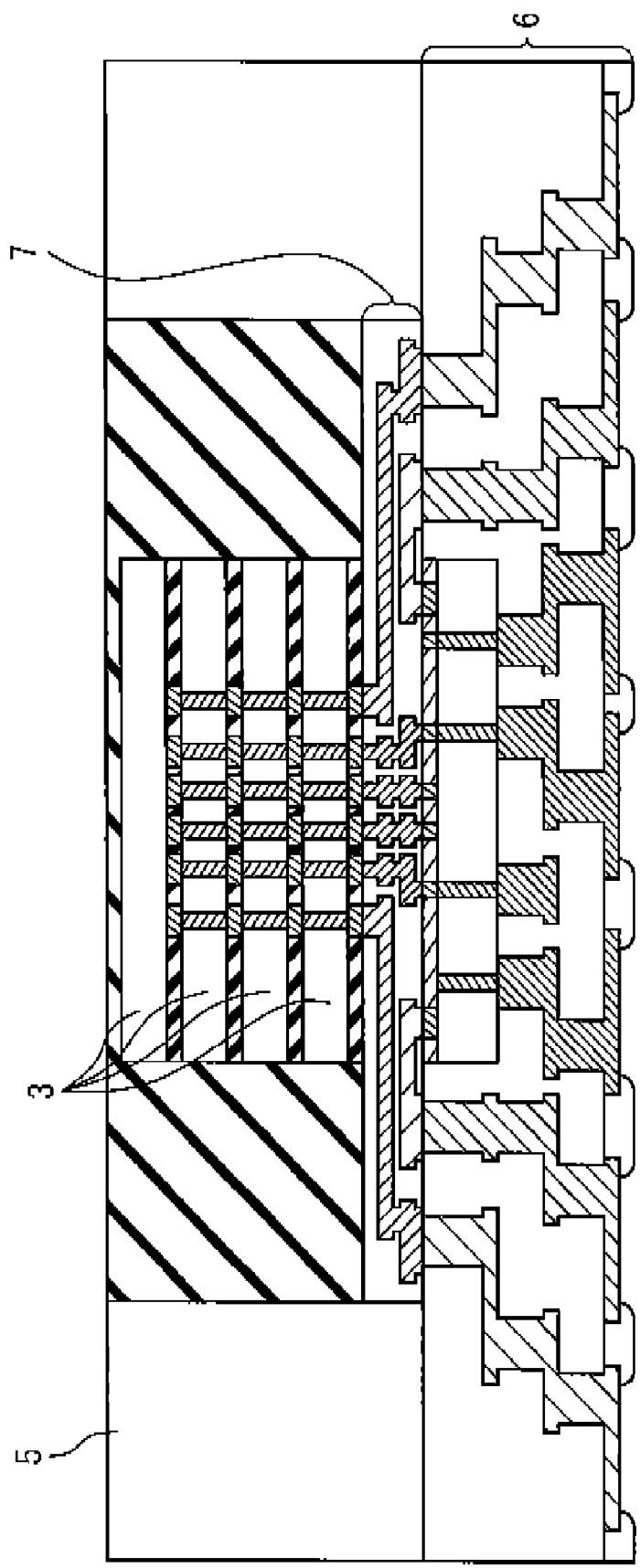

Next, as shown in FIG. 2G, the outer form holding member 5 is arranged on the principal surface of the first interposer 6 to surround the sealing body 4 and the second interposer 7. As the outer form holding member 5, it is possible to use a stiffener made of metal and so on. It should be noted that the outer form holding member 5 may be made of a resin layer. When the outer form holding member 5 is formed of the resin layer, the cuter form holding member 5 may be farmed simultaneously with the collective stack step in which the first interposer 6 is formed. In this case, a half hardening resin for the outer form holding member 5 should be arranged on the first interposer 6 in the collective stack step.

Next, as shown in FIG. 2H, the external electrode 8 is formed on the back surface of the first interposer 6. In this way, the semiconductor device in the present embodiment can be obtained.

As described above, according to the present embodiment, it is not necessary to provide an interconnection for power supply to the first chip 2 for the second interposer 7. Thus, it is possible to secure the space sufficient to arrange the other interconnections in the second interposer 2.

Also, a heat radiation path is formed which reaches the back surface of the first interposer 6 from the circuit forming surface of the first chip 2 according to the present embodiment. Thus, it can prevent heat from being accumulated by the circuit forming surface of the first chip 2, and it is possible to improve the reliability of the first chip 2.

Figure 3A:
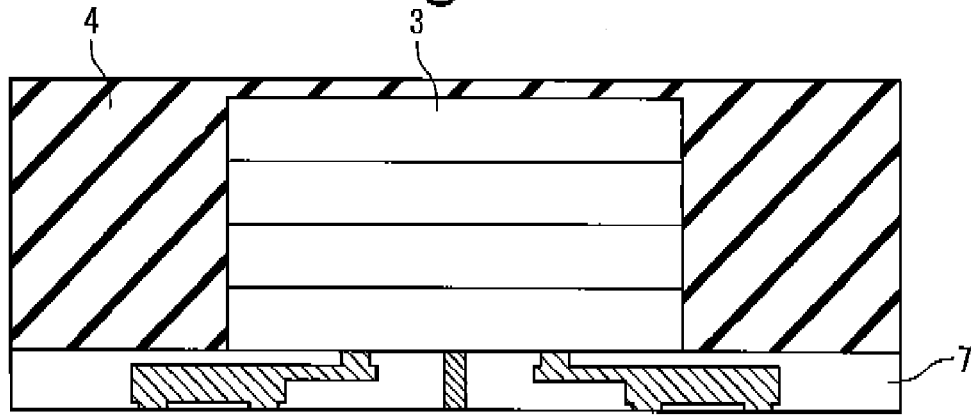
FIGS. 3A to 3C are sectional views schematically showing a modification of the manufacturing method of the semiconductor device according to the first embodiment.
Figure 3B:
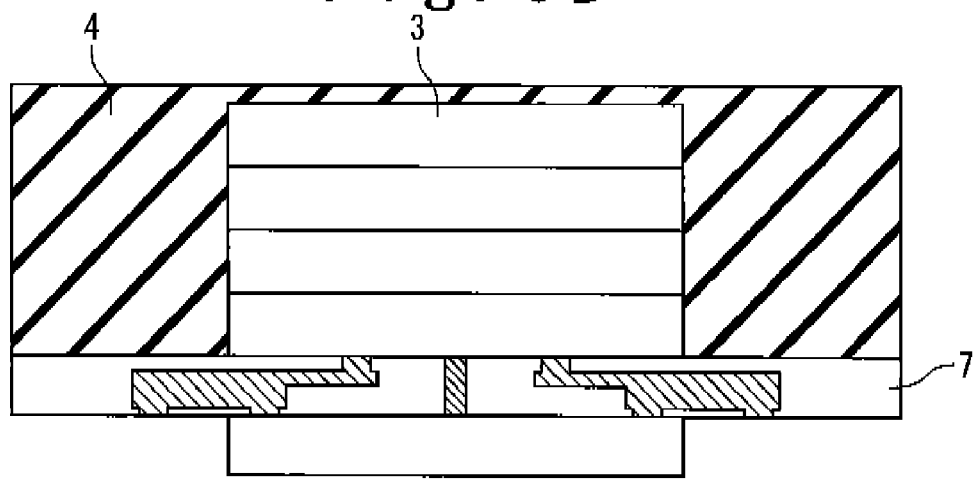
Figure 3C:
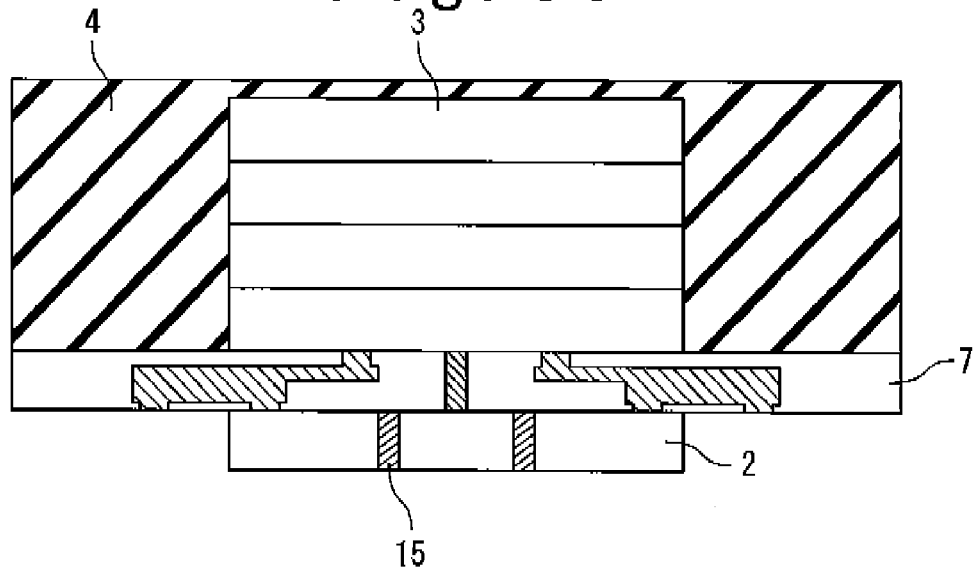

It should be noted that in this embodiment, a case where the first chip 2 having the through electrodes 15 is mounted onto the back surface of the second interposer 7 has been described. However, after the first chip 2 is mounted on the back surface of the second interposer 7, the through electrodes 15 may be formed. FIGS. 3A to 3C are sectional views schematically showing such a manufacturing method. As shown in FIG. 3A, first, the second chip group 3 and the sealing body 4 are formed on the principal surface of the second interposer 7. After that, as shown in FIG. 3B, the first chip 2 is arranged on the back surface of the second interposer 7. At this step, the through electrodes 15 are not yet formed in the first chip 2. After that, as shown in FIG. 3C, the through electrodes 15 are forms in the first chip 2. The process after this is the same as that described in the embodiment mentioned above. Even if the manufacturing method shown in FIGS. 3A to 3C is adopted, the effect similar to that of the present embodiment can be obtained.

Also, in the present embodiment, a case where the support body 17 is used in making the second interposer 7 has been described. However, when the second interposer 7 is formed of a material with a high stiffness such as silicon, ceramic, and glass, it is not always required to use the support body 17. The second chip group 3 and the first chip 2 may be arranged in the both sides of the second interposer 7 without using the support body 17.

Second Embodiment

Next, a second embodiment of the present invention will be described.

Figure 4:
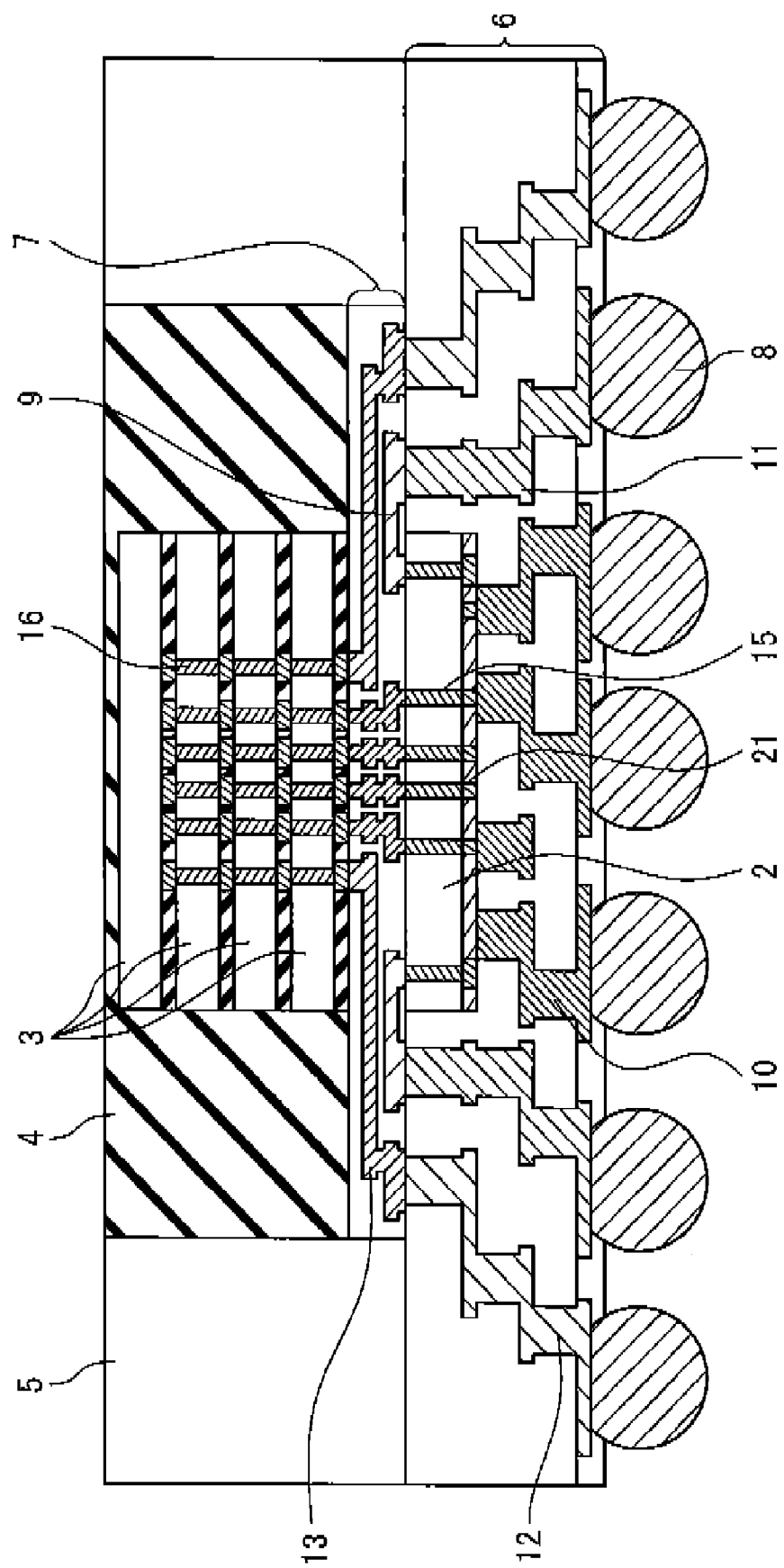
FIG. 4 is a sectional view schematically showing the semiconductor device according to a second embodiment of the present invention.

FIG. 4 is a sectional view schematically showing the semiconductor device according to the second embodiment. In the present embodiment, the first chip 2 contacts the first interposer 6 on the circuit forming surface 21. That is the positions of the front and back surfaces of the first chip 2 are inverse, compared with a case of the first embodiment. Because the other points are the same as in the first embodiment, a detailed description will be omitted.

In the present embodiment, the first chip first interconnection 10 provided in the first interposer 6 is connected with the circuit element on the circuit forming surface 21 of the first chip 2. On the other hand, the first chip second interconnection 9 provided in the second interposer 7 is connected with the through electrode 15 on the surface opposite to the circuit forming surface 21. That is, the first chip second interconnection 9 is connected with the circuit element through the through electrode 15.

Even if the structure in the present embodiment is adopted, the interconnections can be connected to the first chip 2 from the both sides of the first chip 2. Therefore, it is possible to decrease the number of interconnections to be arranged in the second interposer 7, compared with a case to connect the interconnections only from one side of the first chip.

Third Embodiment

Next, a third embodiment of the present invention will be described.

Figure 5:
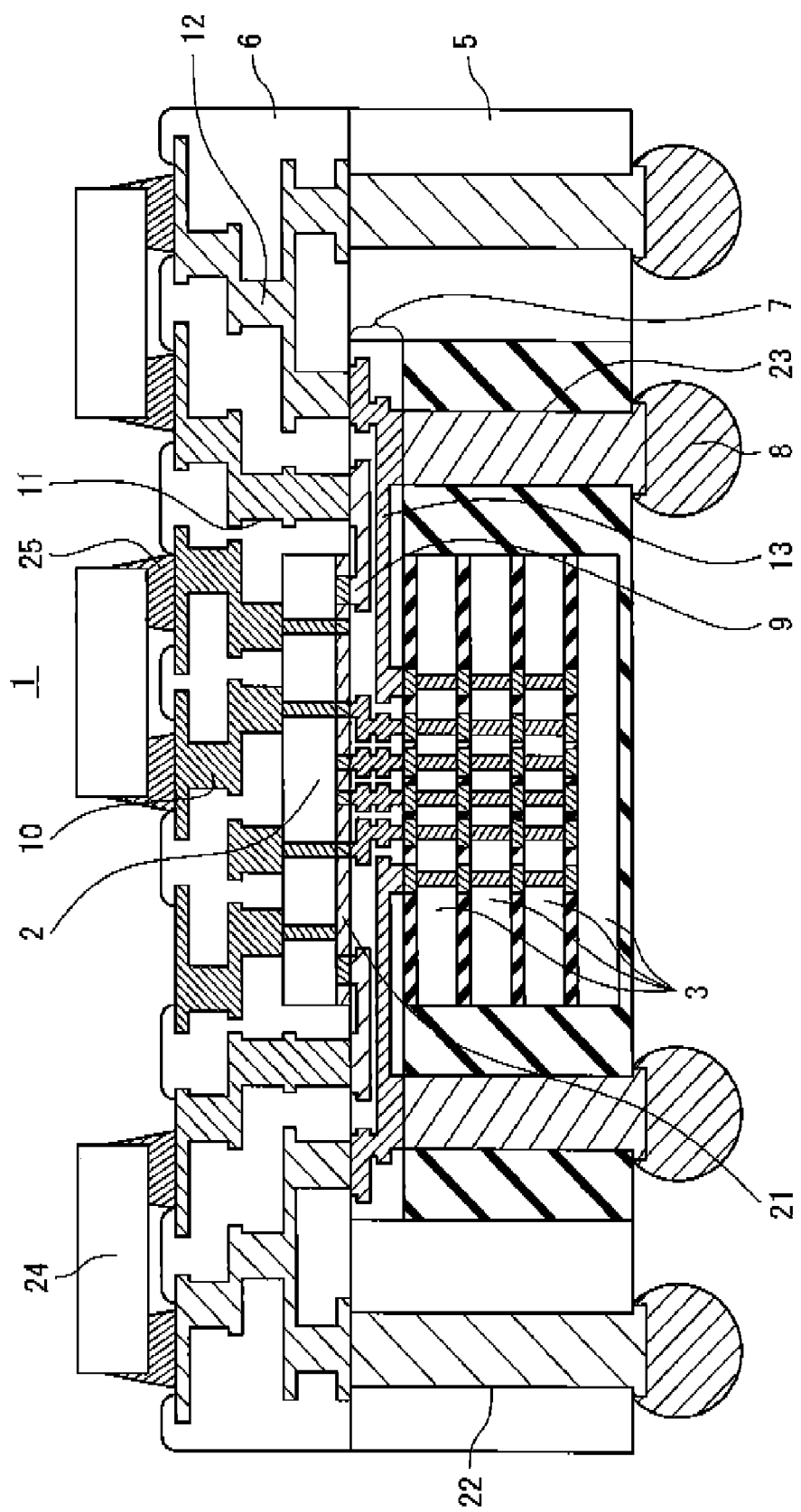
FIG. 5 is a sectional view schematically showing the semiconductor device according to a third embodiment of the present invention.

FIG. 5 is sectional view schematically showing the semiconductor device 1 in the third embodiment. In the first embodiment, a case where the external electrodes 8 are formed on the first interposer 6 has been described. That is, the semiconductor device 1 in the first embodiment is mounted on the side of the first interposer 6 on the printed circuit board and so on. On the other hand, in the semiconductor device 1 in the present embodiment, the external electrodes 8 are provided for the outer form holding member 5 and the sealing body 4. That is, the semiconductor device 1 in the present embodiment, the top and the bottom in the mounting state are inversed to those in the first embodiment. It should be noted that the description of the portions similar to the first embodiment is omitted.

As shown in FIG. 5, in the semiconductor device 1 of the present embodiment, a conductive layer 23 is provided for the sealing body 4. Also, a conductive layer 22 is provided in the outer form holding member 4. The first interposer 6 is arranged on the second interposer 7 and the outer form maintenance material 5. Also, a mounting part 24 (passive element and so on) is mounted onto the first interposer 6 through electrodes 25.

In the first interposer 6, the first chip first interconnection 10, the second chip external interconnection 12 and the interconnection 11 are connected with the mounting part 24 through the electrodes 25. Also, the second chip external interconnection 12 is connected with the external electrode 8 through the conductive layer 22.

In the second interposer 7, the second chip external connection interconnection 13 is connected with the external electrode 8 through the conductive layer 23.

Even if the structure shown in the present embodiment is adopted, the interconnection can be connected to the circuit forming surface 21 of the first chip 2 from the both sides of the first chip. Therefore, it is possible to decrease the number of interconnections to be arranged in the second interposer 7, like the previously mentioned embodiments.

In addition, in the present embodiment, the mounting part 24 can be mounted on the first interposer 6. Therefore, the function of semiconductor device 1 can be improved than in the previously mentioned embodiments.

The first to third embodiments have been described. These are not independent from each other and can be combined and used in a range of no contradiction.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A method of manufacturing a semiconductor device comprising:
   providing a first interposer in which a first chip first interconnection is formed;
   providing a first chip having a circuit forming surface on which a circuit element is formed;
   providing a second interposer in which a first chip second interconnection is formed;
   providing a second chip group;
   forming a through electrode in said first chip to pass from a principal surface to a back surface;
   mounting said second chip group on a principal surface of said second interposer;
   arranging said first chip on a back surface of said second interposer such that said first chip second interconnection is electrically connected with said circuit element; and
   arranging said first chip on said first interposer such that said first chip first interconnection is electrically connected with said circuit element,
   wherein one of said first chip first interconnection and said first chip second interconnection is electrically connected with said circuit element through said through electrode,
   wherein said providing a second interposer comprises forming said second interposer on a support member,
   wherein said mounting said second chip group is performed after said forming said second interposer on said support member,
   wherein said arranging said first chip on a back surface of said second interposer comprises separating said support member from said second interposer; and
   arranging said first chip on the back surface of said second interposer after said separating.

2. The method according to claim 1, wherein said arranging said first chip on a back surface comprises:
   arranging said first chip on the back surface of said second interposer such that said first chip contacts said second interposer on a side of said circuit forming surface, and
   wherein said arranging said first chip on said first interposer comprises:
   arranging said first chip on said first interposer such that said first chip first interconnection is electrically connected with said circuit element through said through electrode.

3. The method according to claim 1, wherein said arranging said first chip on a back surface comprises:
   arranging said first chip such that said first chip second interconnection is electrically connected with said circuit element through said through electrode, and
   wherein said arranging said first chip on said first interposer comprises:
   arranging said first chip such that said first chip contacts said first interposer on a side of said circuit forming surface.

4. The method according to claim 1, wherein said arranging said first chip on said first interposer is carried out after mounting said second chip group and arranging said first chip on a back surface of said second interposer.

5. The method according to claim 1, wherein said forming a through electrode is performed before said mounting said second chip group, said arranging said first chip on the back surface of said second interposer; and said arranging said first chip on said first interposer.

6. The method according to claim 1, wherein said forming a through electrode is performed after said arranging said first chip on the back surface of said second interposer.

* * * * *